(12) United States Patent
Popescu et al.

(10) Patent No.: US 8,920,700 B1
(45) Date of Patent: Dec. 30, 2014

(54) TELESCOPIC NANOTUBE DEVICE FOR HOT NANOLITHOGRAPHY

(75) Inventors: Adrian Popescu, Tampa, FL (US); Lilia M. Woods, Tampa, FL (US)

(73) Assignee: University of South Florida, Tampa, FL (US)

( * ) Notice: Subject to any disclaimer, the term of this patent is extended or adjusted under 35 U.S.C. 154(b) by 1244 days.

(21) Appl. No.: 13/023,782

(22) Filed: Feb. 9, 2011

Related U.S. Application Data

(60) Provisional application No. 61/303,136, filed on Feb. 10, 2010.

(51) Int. Cl.
| | | |
|---|---|---|
| *B82Y 40/00* | (2011.01) | |
| *B26D 7/10* | (2006.01) | |
| *G01Q 70/12* | (2010.01) | |
| *B26D 3/08* | (2006.01) | |
| *B26D 3/06* | (2006.01) | |
| *G01Q 60/24* | (2010.01) | |

(52) U.S. Cl.
CPC . *B82Y 40/00* (2013.01); *B26D 7/10* (2013.01); *B26D 3/085* (2013.01); *B26D 3/065* (2013.01); *G01Q 70/12* (2013.01); *G01Q 60/24* (2013.01)
USPC .......................................................... 264/293

(58) Field of Classification Search
USPC ............................... 264/293; 850/33; 977/876
See application file for complete search history.

(56) References Cited

U.S. PATENT DOCUMENTS

| | | | |
|---|---|---|---|
| 7,234,342 B2 | 6/2007 | Proksch et al. | |
| 7,915,973 B2 * | 3/2011 | Zettl et al. | 333/186 |
| 8,060,943 B1 * | 11/2011 | Popescu et al. | 850/52 |
| 2002/0122873 A1 | 9/2002 | Mirkin et al. | |

OTHER PUBLICATIONS

Milner et al. (Floating Tip Nanolithography. Nano Lett., vol. 8, No. 7, 2017-2022).*
Popescu et al. (A carbon nanotube oscillator as a surface profiling device. Nanotechnology 19 (2008) 435702 1-8).*
Dai et al. (Exploiting the properties of carbon nanotubes for nanolithography. Appl. Phys. Lett., vol. 73, No. 11, 1508-1510).*
Popescu (Telescopic hot double wall carbon nanotube for nanolithography. Appl. Phys. Lett., vol. 95 (2009) 203507 1-3).*
Popescu (Carbon Nanotubes Interactions: Theory and Applications. University of South Florida Graduate Theses and Dissertations (2011)).*
Yenilmez et al. (Wafer scale production of carbon nanotube scanning probe tips for atomic force microscopy. Appl. Phys. Lett. vol. 80, No. 12, 2225-2227).*
Xie et al. (Nanoscale materials patterning and engineering by atomic force microscopy nanolithography. Materials Science and Engineering R 54 (2006) 1-48).*
Chapuis et al. (Heat transfer between a nano-tip and a surface. Nanotechnology 17 (2006) 2978-2981).*

* cited by examiner

*Primary Examiner* — Atul P. Khare
(74) *Attorney, Agent, or Firm* — Nicholas Pfeifer; Smith & Hopen, P.A.

(57) ABSTRACT

A device for maintaining a constant tip-surface distance for producing nanolithography patterns on a surface using a telescopic nanotube for hot nanolithography. An outer nanotube is attached to an AFM cantilever opposite a support end. An inner nanotube is telescopically disposed within the outer nanotube. The tip of the inner nanotube is heated to a sufficiently high temperature and brought in the vicinity of the surface. Heat is transmitted to the surface for thermal imprinting. Because the inner tube moves telescopically along the outer nanotube axis, a tip-surface distance is maintained constant due to the vdW force interaction, which in turn eliminates the need of an active feedback loop.

14 Claims, 4 Drawing Sheets

TELESCOPIC NANOTUBE DEVICE FOR HOT NANOLITHOGRAPHY

CROSS REFERENCE TO RELATED APPLICATION

This application claims priority to U.S. Prov. Pat. Appl. No. 61/303,136, entitled "DOUBLE WALL CARBON NANOTUBE FOR HOT NANOLITHOGRAPHY," filed on Feb. 10, 2010, the contents of which are hereby incorporated by reference.

STATEMENT REGARDING FEDERALLY SPONSORED RESEARCH OR DEVELOPMENT

This invention was made with Government support under Department of Energy contract number DE-FG02-06ER46297. The government has certain rights in this invention.

BACKGROUND OF THE INVENTION

1. Field of the Invention

The invention relates to nanolithography. More particularly, it relates to a device that maintains a constant tip-surface distance for producing hot nanolithography patterns on a surface using a telescopic nanotube.

2. Description of the Related Art

Nanolithography can be accomplished by mechanically scratching a surface with a sharp atomic force microscope (AFM) tip, by exploiting the electromagnetic enhancement of a laser field in the vicinity of a sharp tip for surface ablation, by using hot tips for thermal imprinting on a surface, or by writing with foreign molecules on a surface. Regardless of the implementation of the particular method for surface modification, two challenges in improving AFM tip nanolithography exist. The first challenge includes achieving high spatial resolutions, which is directly related to the sharpness of the tip. The second challenge includes the accurate control of the tip-surface distance, which affects the nanolithography quality.

AFM hot nanolithography has received particular attention due to its promise to meet the demands of high spatial resolution for surface modification in today's continuous race for miniaturization. Since the imprinting resolution is directly related to the tip sharpness, carbon nanotubes (CNT), with their high aspect ratio, appeared naturally as promising candidates for hot tips. CNT also have the advantage of a more robust chemical and mechanical structure, as compared to the conventional Si tips, which are brittle and can change in size and shape during operation. However, the performance of the nanotube tips when operating in AFM tapping or contact mode is affected by forces which laterally bend the CNT, thus limiting the possibility of producing sharp turns on the surface. At the same time, the AFM conventional non-contact operating mode is rather not suitable for hot nanolithography applications, regardless of the type of tips used, since it involves a mean distance too large for proximity tip-surface heat interactions necessary for thermal imprinting. This is due to the feedback loop that involves large amplitude oscillations of the cantilever at its mechanical resonance frequency. One proposed way to overcome this is based on small amplitude forced oscillations of the cantilever at a frequency different from its resonant frequency, together with a custom feedback circuit. However, such a feedback circuit has to be designed differently for each situation since it is specific to the experimental conditions, such as humidity, sample material, position of the laser spot on the cantilever, etc. . . .

Regarding the task of approaching a surface with a sharp tip and maintaining a constant tip-surface distance, the conventional scheme involves approaching the tip until contact is made with the surface and then raising it to the desired distance. If stiff cantilevers are used, sharp tips are likely to break during the contact with the surface. Conversely, if soft cantilevers are used, the tip may stick to the surface and upon lifting it may jump to a distance larger than the desired one.

Moreover, time efficiency of AFM nanolithography can be problematic. In order to increase it, parallel arrays of Si probes are produced. The advantage of such a parallel operation is the decrease in the scan time for a given image area. Again, the difficulties come from controlling the distance between the sample and the individual tips, since there is only one feedback control for the entire array of cantilevers. The lack of feedback control for the individual tips produces large variation in the nanolithography quality from tip to tip. Therefore, new apparatuses and methods are needed to address these challenges for improved nanolithography applications.

SUMMARY OF INVENTION

Generally speaking, the claimed invention is a device that maintains a constant tip-surface distance for producing nanolithography patterns on a surface using a telescopic nanotube for hot nanolithography. The device includes an outer nanotube attached to an AFM cantilever opposite a support end. An inner nanotube is telescopically disposed within the outer nanotube and includes a length larger than the outer nanotube. The tip of the inner nanotube is heated to a sufficiently high temperature and brought in the vicinity of the surface. Heat is transmitted to the surface for thermal imprinting.

The interaction forces in the outer nanotube, inner nanotube, and surface are of van der Waals (vdW) type. As a result, the inner nanotube is positioned at a constant energetically favorable distance from the surface. Because the inner tube moves telescopically along the outer nanotube axis, the tip-surface distance is maintained constant due to the vdW interaction, which in turn eliminates the need of an active feedback loop.

The size of the thermal spot on the surface is mainly determined by the inner nanotube radius. Accordingly, high spatial resolution is achieved if small diameter nanotubes are used.

In an embodiment, the outer nanotube and inner nanotube are carbon. Each nanotube may be single-walled or multi-walled.

In an embodiment, a collimated pulse laser is used for heating the tip of the inner nanotube to a desired temperature.

The method of using the device includes heating the tip of the inner nanotube and bringing it in close proximity to the surface. The axis of the inner and outer nanotubes are positioned perpendicular to the surface, resulting in the inner nanotube moving to an equilibrium position determined by the minimum potential energy due to the vdW forces in the system regardless of the location of the outer nanotube with respect to the surface. Heat is transferred to the surface of the material mainly due to convection or radiation and an imprinted spot on the surface appears. By moving the AFM cantilever parallel to the surface, the inner nanotube is maintained at the equilibrium position due to the vdW forces, and the heated tip thermally imprints on the surface.

In an embodiment, a plurality of parallel arrays of the nanolithography devices are arranged to reduce scan time for a given image area.

Accordingly, a surface can be scanned with the inner nanotube at a constant separation without the need of an active feedback mechanism, thus the long standing problem of accurate tip-surface distance control in existing nanolithography devices is met.

BRIEF DESCRIPTION OF THE DRAWINGS

For a fuller understanding of the invention, reference should be made to the following detailed description, taken in connection with the accompanying drawings, in which.

DETAILED DESCRIPTION OF THE PREFERRED EMBODIMENT

Figure 1:
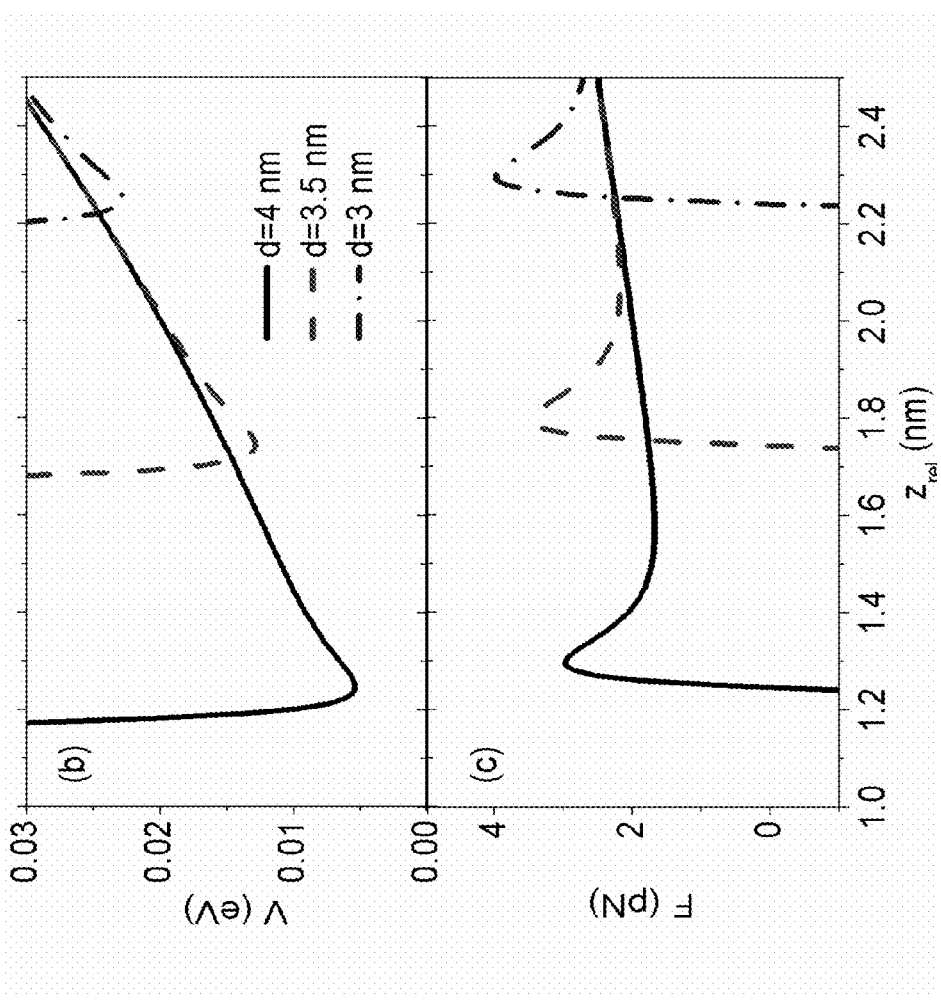
FIG. 1(a) is a schematics of the device close to a surface.
FIG. 1(b) is a graph illustrating the potential energy of the system.
FIG. 1(c) is a graph illustrating the force on the inner tube, as a function of $z_{rel}$ for different values of the distance d between the edge of the outer tube and the surface.
Figure 1:
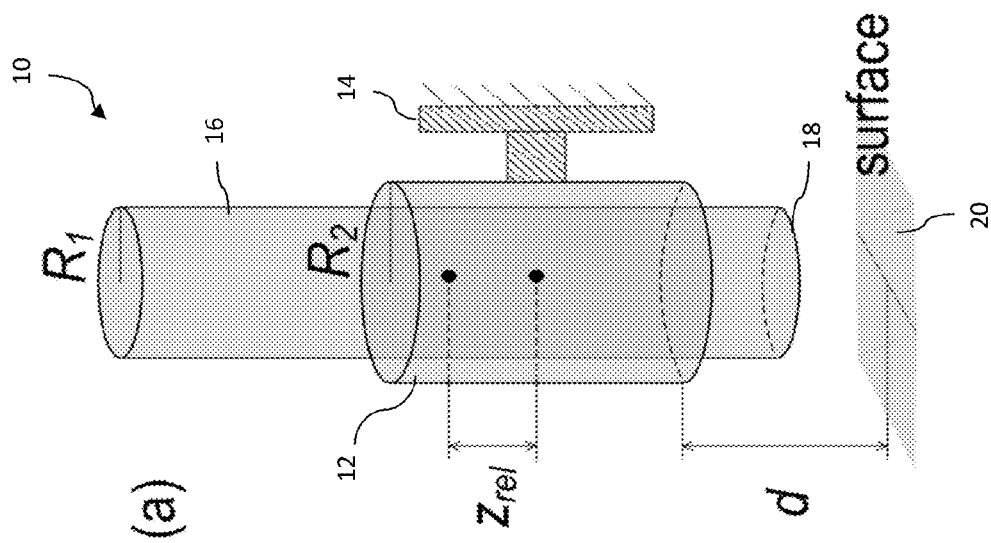

As depicted in FIG. 1(a), the hot nanolithography device is generally denoted as reference numeral 10 and includes an outer nanotube 12 with radius $R_2$ attached to an AFM cantilever 14 opposite a support end. An inner nanotube 16 is telescopically disposed within the outer nanotube 12 and includes a length larger than the outer nanotube 12. The tip 18 of the inner nanotube 16 is heated to a sufficiently high temperature and positioned near a surface 20. The tip-surface distance is denoted as d. Heat is transmitted to the surface 20 and causes thermal imprinting.

The tip-surface distance d is determined by the forces in the outer nanotube, inner nanotube, and surface configuration. Since the outer nanotube is constrained, its interaction with the surface has no effect and it is not considered. The vdW potential energy V in the system is determined by $$V = V_{1-2} + V_{1-s} \quad (1)$$

where $V_{1-2}$ is due to the inner nanotube/outer nanotube interaction and $V_{1-s}$ is due to the inner nanotube/surface interaction. Points on the inner nanotube, outer nanotube, and surface are denoted by cylindrical coordinates $(r_{1,2,s}, \phi_{1,2,s}, z_{1,2,s})$, respectively. The inner nanotube/outer nanotube and inner nanotube/surface potential energies are obtained by integrating the general form of the LJ vdW potential for continuous systems over the surfaces of the nanotubes by $$V_{1-2} = \quad (2)$$
$$4\pi^2 \sigma_0^2 R_1 R_2 \int_{-L_1/2}^{L_1/2} dz_1 \int_{-L_2/2}^{L_2/2} dz_2 \left( -\frac{A_{1-2}}{\eta_1^3} F\left(3, \frac{1}{2}, 1; -\frac{\eta_2}{\eta_1}\right) + \right.$$

-continued
$$\left. \frac{B_{1-2}}{\eta_1^6} F\left(6, \frac{1}{2}, 1; \frac{\eta_2}{\eta_1}\right) \right)$$

$$V_{1-s} = \quad (3)$$
$$4\pi^2 n_s \sigma_0 \int_0^{L_s/1} dz_s \int_{-L_1/2}^{L_s/2} dz_1 \int_0^\infty dr_s r_s R_1 \left( -\frac{A_{1-s}}{\xi_1^3} F\left(3, \frac{1}{2}, 1; -\frac{\xi_2}{\xi_1}\right) + \frac{B_{1-s}}{\xi_1^6} F\left(6, \frac{1}{2}, 1; \frac{\xi_2}{\xi_1}\right) \right)$$

where F(a,b,c;d) represents the hypergeometric function. Also, $\eta_1 = (R_1 - R_2)^2 + (z_{rel} + z_1 - z_2)^2$, $\eta_2 = R_1 R_2$ with $z_{rel}$ being the relative displacement of the nanotubes centers of mass, $\xi_1 = (r_s - R_1)^2 + (L_2/2 + d + z_s - z_1 - z_{rel})^2$, and $\xi_2 = r_s R_1$. The constants $A_{1-2}$, $B_{1-2}$, $A_{1-s}$ and $B_{1-s}$ are the Hamaker coefficients for the inner nanotube/outer nanotube and inner nanotube/surface interactions, respectively, are material dependent, and can be retrieved from existing data or measured separately for a specific inner nanotube/surface system. $n_s$ is the atomic volume density of the surface and $$\sigma_0 = \frac{4}{\sqrt{3}\, a^2}$$

is the surface density of atoms for the nanotube. The force F acting on the inner nanotube is determined by $$F = -\frac{dV}{dz_{rel}}.$$

To illustrate the characteristic behavior of the vdW interaction, a (5,0)@(7,9) device with corresponding radii $R_1 = 1.95$ Å and $R_2 = 5.44$ Å and lengths $L_1 = 20$ nm and $L_2 = 10$ nm is graphically shown in FIGS. 1(a)-1(b). The potential energy V and the force F are calculated by numerically integrating Eqs. (2) and (3) and are shown in FIGS. 1(b) and 1(c) for different values of the distance d. In this example, the inner nanotube/surface Hamaker coefficients are the same values as for the graphene-graphene system—$A_{1-s} = A_{1-2}$ and $B_{1-s} = B_{1-2}$. Choosing different values for $A_{1-s}$ and $B_{1-s}$ does not change the qualitative picture. When the device is far from the surface, its equilibrium position occurs when the centers of mass of the inner and outer nanotubes coincide ($z_{rel} = 0$). When approaching the surface, the inner nanotube will start to sense its influence. As a result, the potential energy in the system exhibits a minimum (as illustrated in FIG. 1(b)) which is always at the same inner nanotube-surface distance $d_0 \sim 2.5$ Å, independent of the position of the outer nanotube relative to the surface. The value of $d_0$ slightly differs for different sample materials because of the material dependent Hamaker constants, but it is always on the order of 2-3 Å, which is characteristic for systems that are stable due to vdW forces.

Therefore, by laterally scanning the surface, the inner nanotube follows the surface at a constant distance $d_0$ without the need of an active feedback mechanism. This is advantageous for an array of nanolithography devices including tips operating in parallel, since each inner nanotube will follow the surface at that constant distance with no active feedback required.

In an embodiment, the inner nanotube tip is heated by a pulse laser to a desired temperature ($T_{tip}$). In an example embodiment, the surface is assumed to be at room temperature $T_0=300$ K, and the entire system is in the environment of air also at $T_0=300$ K. Heat is exchanged from the tip to the surface through convection or radiation. The convection heat transfer is due to the air molecules which are modeled as nitrogen molecules to a first approximation. At room temperature and atmospheric pressure, their mean free path is $\lambda=55$ nm. Since the tip equilibrium distance to the surface (~2.5 Å) is much smaller than the mean free path $\lambda$, the heat transport is mainly ballistic. Furthermore, the incident molecule at $T_0=300$ K is heated instantaneously when impacting the hot nanotube by adopting a Maxwellian velocity distribution at $T_{tip}$. After that, the molecule travels from the inner nanotube to the surface ballistically, where it transfers all of its kinetic energy.

The heat transfer between objects is described by the heat flux per unit area emitted from the surface of one tube by $\Phi_{tip}=n_{tip}mv_{rms}^2/2$, where $n_{tip}$ is the number of air molecules per unit area emerging from the tube surface, m is the diatomic molecular mass, and $$v_{rms} = \left( \int_0^\infty v^2 f(v)\, dv \right)^{\frac{1}{2}}$$

is the root mean square of the velocity v with f(v) being the Maxwell distribution. $n_{tip}$ is calculated by imposing an equilibrium condition which requires that the molecular flux emitted from the nanotube surface equals the molecular flux incident at the surface $$n_{tip} = n_0 \left(\frac{T_{tip}}{T_0}\right)^{\frac{3}{2}} \frac{\int_0^\infty v^3 \exp\left(\frac{-mv^2}{2k_B T_0}\right) dv}{\int_0^\infty v^3 \exp\left(\frac{-mv^2}{2k_B T_{tip}}\right) dv} \tag{4}$$

where $n_0$ is the number of incident air molecules per unit area at room temperature and $k_B$ is the Boltzmann constant. An estimate of the emitted heat flux per unit area at $T_{tip}=500$ K, for example, gives $\Phi_{tip}\sim 0.32$ MWm$^{-2}$, which is enough for thermally imprinting on surfaces.

The heated object behaves like an antenna radiating electromagnetic field. The radiation heat flux is much smaller than the convection heat transport ranging from one order of magnitude smaller for a silicon surface to four orders of magnitude smaller for a silver surface. Therefore this kind of heat transport is neglected here.

Figure 2:
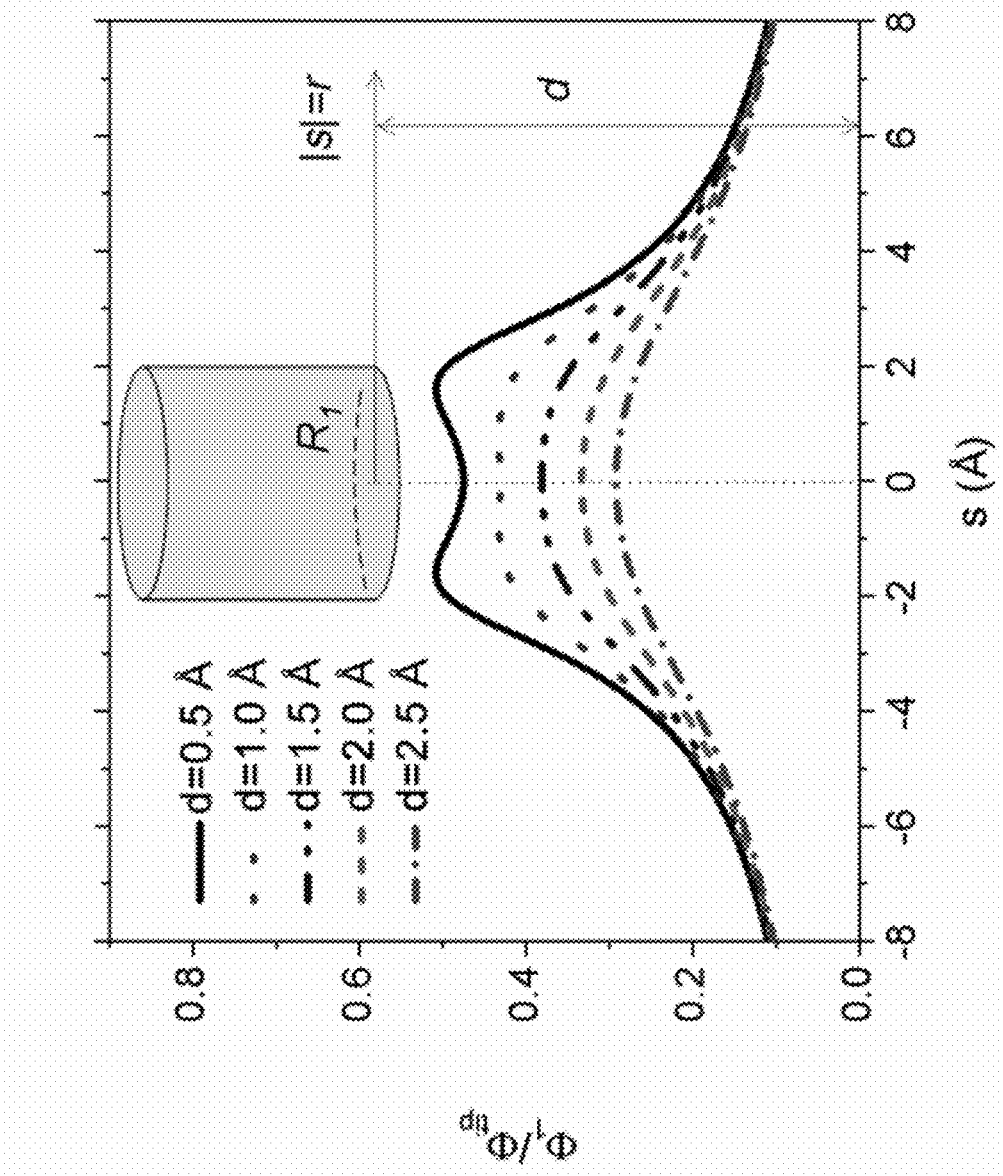
FIG. 2 is a graph illustrating heat flux distribution on a surface under a tube of radius $R_1$ in terms of the emitted heat flux per unit area $\Phi_{tip}$.

The heat flux coming from one nanotube only is denoted by $\Phi_1$. In steady state conditions, $\Phi_1$ is expressed in terms of the emitted heat flux per unit area $\Phi_{tip}$ as $$\Phi_1 = \frac{R_1 \Phi_{tip}}{4\pi} \sum_{i=1}^{3} \int_{-\theta_i}^{\theta_i} d\theta \left[ \frac{1}{\sqrt{d^2 + r^2 + R_1^2 - 2rR_1\cos\theta}} - \frac{1}{\lambda} \right] \tag{5}$$

where r is the radial cylindrical coordinate (see FIG. 2). The integration limits $$\theta_1 = \pi, \theta_2 + \cos^{-1}\left(\frac{R_1}{r}\right),$$

and $$\theta_3 = -\cos^{-1}\left(\frac{R_1}{r}\right)$$

correspond to the heat coming from the interior of the tube to the surface delimited by $r<R_1$, $r>R_1$ and from the exterior of the nanotube to the surface, respectively.

The ratio of the incident heat flux on the surface and the emitted heat flux of one nanotube for several values of the separation distance d is shown in FIG. 2. The inner nanotube from the (5,0)@(7,9) device is taken as an example. For separations smaller than a certain threshold value $d_t$, the thermal spot reproduces the tube cylindrical geometry. For separations larger than $d_t$, this signature is lost and the deposited heat flux becomes axisymmetric with one maximum at r=0. By considering tubes with various radii, the threshold separation distance $d_t$ is approximately half of the radius of the nanotube, i.e., $d_t \approx R_1/2$.

Figure 3:
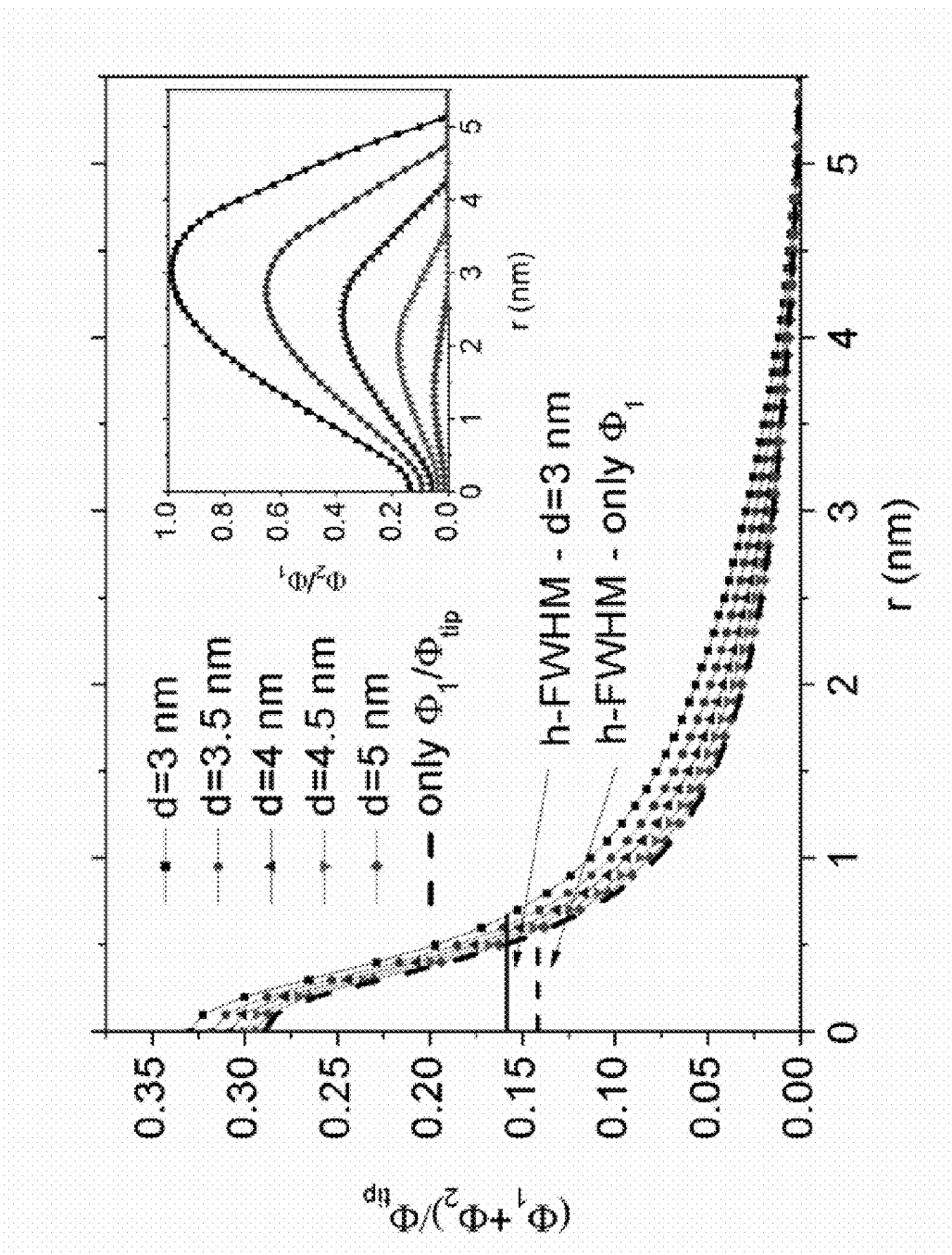
FIG. 3 is a graph illustrating the total incident heat flux in terms of $\Phi_{tip}$, where the dashed line is the heat flux from the inner tube only and the inset shows the relative contribution of the heat flux from the outer tube to the one from the inner tube as a function of r.

The surface heat distribution is determined by the total incident heat flux $\Phi=\Phi_1+\Phi_2$, where $\Phi_1$ and $\Phi_2$ are the heat fluxes from the inner and outer nanotube, respectively. Due to the vdW forces, the inner nanotube will be in its equilibrium position $d_0=2.5$ Å, whereas the outer nanotube will be located at a separation d. $\Phi$ for the (5,0)@(7,9) example is shown in FIG. 3 for different values of d in terms of the emitted heat flux per unit area $\Phi_{tip}$. The results are for $d \in [3,5]$ nm, which corresponds to $z_{rel} < 2$ nm. The heat flux $\Phi_1$ coming from the inner nanotube only is given for reference. The inset in the figure shows the relative contribution of the heat flux from the outer nanotube with respect to the one from the inner nanotube as a function of the radial distance r.

The customary definition of the spatial resolution for nanolithography tips is defined as the full width half maximum (FWHM) of the heat profile. As shown in FIG. 3, the FWHM is mainly determined by the heat flux from the inner nanotube (only half of the FWHM is shown). The heat contribution coming from the outer nanotube, for this range of distances d and lengths of the device accounts for less than 10% of the total FWHM. Thus, it is possible to achieve a high spatial resolution by using CNT with small diameters. In the above example, with a (5,0)@(7,9), for d=5 nm and d=3 nm, the FWHM is about 1.2 nm and 1.4 nm, respectively.

Figure 4:
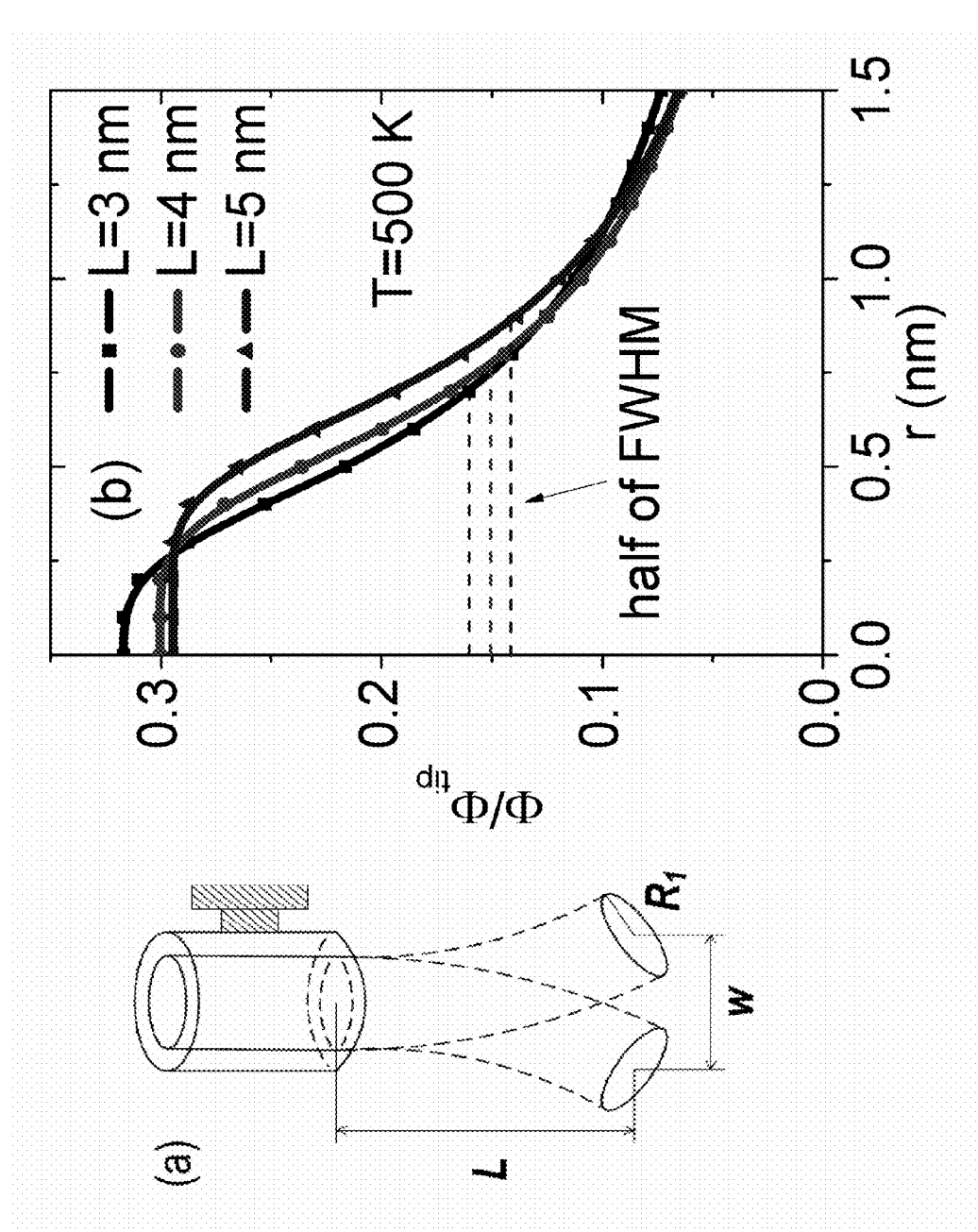
FIG. 4(a) is a model of the DWNT thermal vibration.
FIG. 4(b) illustrates incident heat flux in terms of the emitted heat flux per unit area $\Phi_{tip}$, with thermal vibration taken into account. Half of FWHM is also shown.

A phenomenon which affects the tip spatial resolution is the thermal vibrations of the nanotube as a whole. Such vibrations limit the high spatial resolution of the nanotube for hot nanolithography. Most of the outer nanotube is attached to the AFM cantilever, therefore the outer nanotube does not thermally vibrate. Since the part of the inner nanotube that is inside the outer nanotube is constrained to stay radially symmetric by the vdW forces between the nanotubes, only the vibrations of the telescoped portion of the inner nanotube closest to the surface are important. The thermally vibrating part of the inner nanotube closest to the surface, with length L, is shown in FIG. 4a. It can be described as a cylinder clamped at one end using a mechanical model. The amplitude w of the thermal vibrations at the end of the nanotube is estimated using the relation $w=(4k_B T L^3/3\pi/R_1^4 Y)^{1/2}$, where $k_B$ is the Boltzmann constant, T—the absolute temperature of the tube, L—the length of the inner nanotube isolated part, and Y—the carbon nanotube Young modulus.

The Young modulus is taken to have its experimental value $Y=1$ TPa for nanotubes with this radial size. Since $w \propto T^{1/2}$ and $w \propto L^{3/2}$, the amplitude will be larger for longer tubes heated at higher temperatures. These features are illustrated in FIG. 4b, where the heat flux distribution on the surface in the presence of the thermal vibrations is shown. For example, the FWHM for the inner nanotube with L=3 nm is 1.5 nm, while it is 1.7 nm for the nanotube with L=5 nm. Even though the increase in FWHM is relatively large, the resolution of the tip is still high due to the small diameter CNT.

The operation of the device includes heating the tip and bringing it in close proximity of a sample surface with the aid of the AFM cantilever. The axis of the nanotube is perpendicular to the surface. The inner nanotube moves to the equilibrium position determined by the minimum potential energy due to the vdW forces (~0.3 nm) in the system regardless of the location of the outer nanotube with respect to the surface. Heat is transferred to the surface of the material mainly due to convection and an imprinted spot on the surface appears. By moving the cantilever parallel to the surface, the inner tube is always at the equilibrium position due to the vdW forces, and the device thermally imprints on the surface. The sample surface is laterally scanned with the inner nanotube at a constant separation without the need of an active feedback mechanism. Accordingly, the long standing problem of accurate tip-surface distance control in existing nanolithography devices is solved.

It will thus be seen that the objects set forth above, and those made apparent from the foregoing disclosure, are efficiently attained. Since certain changes may be made in the above construction without departing from the scope of the invention, it is intended that all matters contained in the foregoing disclosure or shown in the accompanying drawings shall be interpreted as illustrative and not in a limiting sense.

It is also to be understood that the following claims are intended to cover all of the generic and specific features of the invention herein disclosed, and all statements of the scope of the invention that, as a matter of language, might be said to fall therebetween.

What is claimed is:

1. A nanolithography patterning method comprising steps of:
   providing an atomic force microscope supporting a cantilever at a cantilever support end thereof, the cantilever further supporting at a side opposite the cantilever support end an outer nanotube having radius $R_2$ within which an inner nanotube having radius $R_1$ and a length longer than that of the outer nanotube is telescopically disposed;
   heating a tip of the inner nanotube to a desired temperature by applying a heat source thereto; and
   imprinting a desired pattern onto a material surface by bringing the heated tip into close proximity with said surface and moving the cantilever parallel to the surface, the inner nanotube telescopically moving during said bringing and moving to an equilibrium position determined by a minimum potential energy due to van der Waals forces, said equilibrium position providing a constant distance between the tip and surface.

2. The method as claimed in claim 1, further comprising a step of forming the outer and inner nanotubes from carbon.

3. The method as claimed in claim 1, further comprising providing a laser as the heat source.

4. The method as claimed in claim 3, wherein the laser is a collimated pulse laser.

5. The method as claimed in claim 1, wherein said imprinting is conducted without use of an active feedback loop.

6. The method as claimed in claim 1, further comprising a step of selecting the inner nanotube radius $R_1$ so as to provide a desired imprinting resolution.

7. The method as claimed in claim 1, wherein each of the inner and outer nanotubes are single-walled.

8. The method as claimed in claim 1, wherein each of the inner and outer nanotubes are double-walled.

9. The method as claimed in claim 1, wherein the inner and outer nanotubes extend along an axis perpendicular to the surface.

10. The method as claimed in claim 1, wherein said imprinting is due to heat transfer by convection or radiation.

11. The method as claimed in claim 1, further comprising providing the inner and outer nanotubes in a plurality of parallel arrays arranged to reduce scan time for a given image area.

12. The method as claimed in claim 1, wherein said constant distance is on the order of 2-3 angstroms regardless of a location of the outer nanotube with respect to the surface.

13. The method as claimed in claim 1, wherein heat contribution from the outer nanotube accounts for less than 10% of a total full width half maximum of a tip heat profile.

14. The method as claimed in claim 1, wherein most of the outer nanotube is attached to the cantilever.

* * * * *